United States Patent
Pust et al.

(10) Patent No.: US 10,243,115 B2
(45) Date of Patent: Mar. 26, 2019

(54) SEMICONDUCTOR COMPONENT

(71) Applicant: OSRAM Opto Semiconductors GmbH, Regensburg (DE)

(72) Inventors: Philipp Pust, Langquaid (DE); David Racz, Regensburg (DE); Christopher Kölper, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/776,686

(22) PCT Filed: Nov. 17, 2016

(86) PCT No.: PCT/EP2016/078047
§ 371 (c)(1),
(2) Date: May 16, 2018

(87) PCT Pub. No.: WO2017/085207
PCT Pub. Date: May 26, 2017

(65) Prior Publication Data
US 2018/0358516 A1  Dec. 13, 2018

(30) Foreign Application Priority Data
Nov. 17, 2015  (DE) .................. 10 2015 119 817

(51) Int. Cl.
*H01L 33/50*  (2010.01)
*H01L 33/54*  (2010.01)
(Continued)

(52) U.S. Cl.
CPC .......... *H01L 33/504* (2013.01); *H01L 33/502* (2013.01); *H01L 33/505* (2013.01);
(Continued)

(58) Field of Classification Search
None
See application file for complete search history.

(56) References Cited

U.S. PATENT DOCUMENTS

2005/0230693 A1  10/2005  Chen
2007/0045609 A1  3/2007  Saxler
(Continued)

FOREIGN PATENT DOCUMENTS

DE  10 2012 109 217 A1  4/2014
DE  20 2013 101 431 U1  7/2014
(Continued)

OTHER PUBLICATIONS

Schiavon, Dario "Optically pumped GaInN/GaN multiple quantum wells for the realization of efficient green light-emitting devices" App. Phys. Lett. 102, published Mar. 20, 2013 pp. 113509-1 through 113509-4 (Year: 2013).*

(Continued)

*Primary Examiner* — Asok K Sarkar
*Assistant Examiner* — Grant S Withers
(74) *Attorney, Agent, or Firm* — DLA Piper LLP (US)

(57) ABSTRACT

A semiconductor component has a semiconductor chip that generates an electromagnetic primary radiation having a first peak wavelength, having a first conversion element, which has a quantum structure, wherein the quantum structure is formed to partially shift the primary radiation to a secondary radiation having a second peak wavelength, wherein a second conversion element is provided which has a luminescent material, wherein the luminescent material is formed to shift an electromagnetic radiation to a tertiary radiation having a dominant wavelength, wherein the first conversion element is formed to generate secondary radiation, which has a lower peak wavelength than the dominant wavelength of the tertiary radiation.

14 Claims, 3 Drawing Sheets

(51) Int. Cl.
*H01L 33/56* (2010.01)
*H01L 33/60* (2010.01)

(52) U.S. Cl.
CPC ............ *H01L 33/507* (2013.01); *H01L 33/54* (2013.01); *H01L 33/56* (2013.01); *H01L 33/60* (2013.01)

(56) References Cited

U.S. PATENT DOCUMENTS

| | | |
|---|---|---|
| 2009/0153024 A1 | 6/2009 | Liu et al. |
| 2009/0173961 A1 | 7/2009 | Windisch et al. |
| 2009/0302307 A1 | 12/2009 | Grönninger et al. |
| 2010/0155694 A1 | 6/2010 | Miller et al. |
| 2015/0123153 A1 | 5/2015 | Setlur et al. |
| 2015/0129916 A1 | 5/2015 | Bera et al. |
| 2015/0252963 A1 | 9/2015 | Stoll et al. |
| 2016/0053949 A1 | 2/2016 | Zehetner et al. |
| 2016/0284931 A1 | 9/2016 | Tångring et al. |

FOREIGN PATENT DOCUMENTS

| | | |
|---|---|---|
| DE | 10 2013 112 740 A1 | 5/2015 |
| TW | 200618428 | 6/2006 |
| TW | 200735421 | 9/2007 |
| TW | 200810159 | 2/2008 |

OTHER PUBLICATIONS

Pust, P. et al., "Narrow-band red-emitting $Sr[LiAl_3N_4]:Eu^{2+}$ as a next-generation LED-phosphor material", *Nature Materials*, 2014, vol. 13, No. 9, pp. 891-896.

Sheu, J.-K. et al., "GaN-based photon-recycling green light-emitting diodes with vertical-conduction structure", Optics Express, 2015, vol. 23, No. 7, pp. A371-A381.

Notification for the Opinion of Examination dated Apr. 30, 2018, of corresponding Taiwanese Application No. 105137426 in English.

* cited by examiner

SEMICONDUCTOR COMPONENT

TECHNICAL FIELD

This disclosure relates to a semiconductor component having a semiconductor chip that generates an electromagnetic primary radiation.

BACKGROUND

For the backlighting of display devices, for example, liquid crystal displays (LCDs), light-emitting diodes can be used as radiation sources. However, such applications require a high gamut to represent the largest possible proportion of the colors perceptible by the human eye. For example, LEDs that emit in the blue spectral range and have a luminescent material emitting in the yellow spectral range, can be used for radiation that appears white to the human eye with high efficiency, but with reduced gamut. The gamut can be improved by adding further luminescent materials, but the efficiency decreases. A high color gamut can also be achieved, when three different light-emitting diodes directly generate radiation in the red, green and blue spectral range. However, this requires complex electronic control due to the control of three light-emitting diodes.

It could therefore be helpful to provide a semiconductor component with which a mixed radiation can be achieved with high efficiency.

SUMMARY

We provide a semiconductor component including a semiconductor chip that generates an electromagnetic primary radiation, which is blue light, having a first peak wavelength, having a first conversion element having a quantum structure and the quantum structure includes a plurality of quantum layers, between which barrier layers are arranged so that the quantum layers and the barrier layers form a multiple quantum well structure, wherein the quantum structure is formed to partially shift the primary radiation to a secondary radiation having a second peak wavelength and the secondary radiation is green light, and a second conversion element having a luminescent material, wherein the luminescent material has an $Eu^{2+}$-doped nitride or a $Mn^{4+}$-doped fluoride and is formed to shift an electromagnetic radiation to a tertiary radiation having a dominant wavelength, wherein the first conversion element is formed to generate a secondary radiation having a lower peak wavelength than the dominant wavelength of the tertiary radiation and the tertiary radiation is red light.

REFERENCE SIGN LIST 1 semiconductor component
2 substrate
3 semiconductor chip
4 first conversion element
5 support
6 quantum structure
7 second conversion element
8 protective layer
9 lower section of the protective layer
10 upper section of the protective layer
11 first contact surface
12 second contact surface
13 first adhesive layer
14 second adhesive layer
15 dielectric layer
16 second quantum structure
17 cover layer
21 first section of the wavelength spectrum
22 second section of the wavelength spectrum
23 third section of the wavelength spectrum

DETAILED DESCRIPTION

Our semiconductor component has one or more semiconductor chips that generate an electromagnetic primary radiation having a first peak wavelength. In addition, at least one first conversion element having a quantum structure is provided, wherein the quantum structure is formed to partially shift the primary radiation to a secondary radiation having a second peak wavelength. Furthermore, at least one second conversion element is provided that has a luminescent material, wherein the luminescent material is formed to shift an electromagnetic radiation to a tertiary radiation having a dominant wavelength. In addition, the first conversion element is formed to generate secondary radiation that has a lower peak wavelength than the tertiary radiation.

Preferably, precisely one first conversion element and one second conversion element and no further conversion elements are present. The light source used is preferably only the one or more semiconductor chips.

Since the first conversion element is formed to generate secondary radiation that has a lower peak wavelength than the dominant wavelength of the tertiary radiation, an efficient color generation is made possible. In addition, a large color space (gamut) can be achieved with a relatively simply constructed semiconductor component.

Furthermore, with the aid of the quantum structure, in particular compared to conversion elements with luminescent materials, a spectrally narrowband emission can be achieved, for example, with a full width at half maximum (FWHM) of less than 50 nm, in particular in the region of 30 nm, while luminescent materials typically have an emission with a full width half maximum between approximately 50 and 100 nm. As a result, a higher color purity can be achieved as a result of which a high gamut can be achieved with high efficiency.

The primary radiation and/or the secondary radiation may have a full width half maximum (FWHM) of at least 15 nm or 20 nm or 25 nm. Alternatively or additionally, this full width half maximum of the primary radiation and/or of the secondary radiation is at most 50 nm or 40 nm or 30 nm.

The tertiary radiation may have a full width half maximum (FWHM) of at least 20 nm or 30 nm or 40 nm. Alternatively or additionally, this full width half maximum is at most 80 nm or 60 nm or 45 nm. It is possible that the full width half maximum of the tertiary radiation is at least 100% or 110% and/or at most 150% or 180% of the full width half maximum of the primary radiation and/or of the secondary radiation.

Conversion elements having a quantum structure can furthermore be distinguished by a low layer thickness. While second conversion elements with luminescent materials typically have a layer thickness of approximately 30 μm to 300 μm, a first conversion element having a quantum structure, a layer thickness of less than 1 μm, for example, 100 nm to 1 μm can be achieved. The heat losses produced during operation can thus be dissipated more efficiently.

The second conversion element may be formed with the luminescent material to generate a tertiary radiation having a red spectral range having a dominant wavelength between 590 nm and 640 nm. As a result, the available color space is improved. In other words, the tertiary radiation is preferably red light.

The second conversion element may be formed with the luminescent material to generate tertiary radiation having a dominant wavelength between 590 nm and 625 nm, in particular between 595 nm and 610 nm. As a result, the available color space is further improved.

The second conversion element may be formed with the luminescent material to generate tertiary radiation having a dominant wavelength between 610 nm and 633 nm, in particular between 617 nm and 624 nm. As a result, a further improvement of the available color space is achieved.

The phosphor may comprise $Eu^{2+}$ doped nitrides or $Mn^{4+}$ doped fluorides. Using these luminescent materials, an efficient material system for the desired color space can be provided. These materials are particularly suitable to generate the desired tertiary radiation.

The luminescent material may be selected from the following group: $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$, $(K,Na)_2(Si,Ti)F_6:Mn^{4+}$.

The semiconductor chip may be formed to generate a primary radiation having a blue spectral range having a peak wavelength and/or a dominant wavelength of at least 380 nm or 400 nm or 420 nm or 430 nm and/or of at most 480 nm or 460 nm. In other words, the primary radiation is preferably blue light.

The first conversion element may be formed to generate a secondary radiation having a green spectral range having a peak wavelength and/or a dominant wavelength between 520 nm and 545 nm. In other words, the secondary radiation is preferably green light.

The quantum structure may comprise a plurality of quantum layers, between which barrier layers are arranged so that the quantum layers and the barrier layers alternately alternate and form a multiple quantum well structure. The quantum structure can consist of such quantum layers and barrier layers. The quantum layers can also be referred to as quantum wells and are preferably two-dimensional quantum structures. That is to say, a thickness of the quantum layers is much smaller than lateral extents of the quantum layers. The quantum structure is particularly preferably grown epitaxially, for example, on a light-transmissive growth substrate such as sapphire. The quantum structure can be located on the growth substrate and in the semiconductor component. In particular, the quantum structure is not quantum dots. Quantum dots are approximately zero-dimensional, in contrast to the two-dimensional quantum layers.

The quantum structure may comprise at least 5 or 10 or 20 and/or at most 200 or 100 or 50 of the quantum layers. Alternatively or additionally, a thickness of the quantum layers is at least 1.5 nm or 2 nm or 2.5 nm and/or at most 6 nm or 4 nm or 3.5 nm. The same values can apply to the barrier layers. In this context, the quantum layers are preferably based on the material system $In_xGa_{1-x}N$. For the indium content, for example, $0.2 \leq x$ or $0.25 \leq x$ and/or $x \leq 0.4$ or $x \leq 0.35$. The barrier layers can be made of $Al_yGa_{1-y}N$ or GaN, wherein, for example, $0.05 \leq y$ or $0.1 \leq y$ and/or $y \leq 0.5$ or $y \leq 0.4$.

The second conversion element may be located between the semiconductor chip and the first conversion element. In this case, the second conversion element can touch the semiconductor chip or be spaced apart from the semiconductor chip.

The first conversion element may be arranged on the semiconductor chip, and wherein the second conversion element is arranged on the first conversion element, wherein the first conversion element has a transparent carrier, wherein the quantum structure is arranged on an underside of the carrier, wherein the underside faces the semiconductor chip, and wherein the carrier consists in particular of sapphire. The components can follow one another directly and can thus be in contact or alternatively spaced apart from one another.

The carrier may have a Bragg mirror layer on an upper side facing the second conversion element.

The second conversion element may be arranged on the semiconductor chip, and wherein the first conversion element is arranged on the second conversion element, wherein the first conversion element has a transparent carrier, wherein the quantum structure is arranged on an underside of the carrier, wherein the underside faces the second conversion element, and wherein the carrier consists in particular of sapphire. The components can follow one another directly and can thus be in contact or alternatively spaced apart from one another.

The carrier may have a second quantum structure on an upper side. As a result, the proportion of secondary radiation is increased. The two quantum structures can be formed identically or differently from one another.

The above-described properties, features and advantages and the manner in which they are achieved become clearer and more clearly understandable in connection with the following description of examples that are explained in more detail in connection with the figures.

The semiconductor component has a semiconductor chip formed to generate a primary radiation having a first peak wavelength, and a first conversion element having a quantum structure which is arranged above the semiconductor chip. The semiconductor component also has a second conversion element that generates an electromagnetic tertiary radiation having a dominant wavelength. Furthermore, in one example, the first conversion element has a substrate transmissive to the primary radiation and the secondary radiation that consists, for example, of sapphire. The quantum structure is arranged on the substrate or integrated in the substrate.

The second peak wavelength is greater than the first peak wavelength. For example, the second peak wavelength is in the green spectral range and the dominant wavelength of the tertiary radiation is in the red or yellow spectral range. For example, the first peak wavelength is in the blue spectral range.

Figure 1:
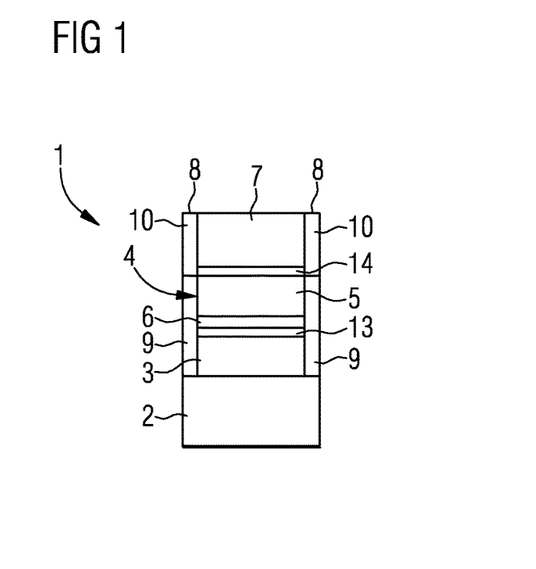
FIG. 1 shows a first example of a semiconductor component.

FIG. 1 shows a schematic illustration of a first example of a semiconductor component 1. The semiconductor component 1 has a substrate 2 on which a semiconductor chip 3 is arranged. A first conversion element 4 is arranged on the semiconductor chip 3. The first conversion element 4 has a carrier 5 on the underside of which a quantum structure 6 in the form of a layer is applied. The quantum structure 6 faces an upper side of the semiconductor chip.

In the context of the application, the term quantum structure comprises, in particular any structure, in which charge carriers can experience a quantization of their energy states by confinement and, therefore, an incident electromagnetic primary radiation is converted at least partially in the wavelength to a secondary radiation having a second peak wavelength. In particular, the term quantum structure does not contain any indication about the dimensionality of the quantization. It thus comprises, inter alia, quantum wells, quantum wires and quantum dots and any combination of these structures.

Particularly preferably, the quantum structure has a plurality of quantum layers, between which barrier layers are arranged. For example, the quantum layers and the barrier layers form a multiple quantum well structure. The quantum layers and the barrier layers preferably extend continuously over the first conversion element in the same composition.

The first conversion element 4 has, for example, a substrate transmissive to the primary radiation. In particular, the substrate serves for the mechanical stabilization of the quantum structure. For example, the substrate is at least five times as thick as the quantum structure. The substrate can be a growth substrate for the, for example, epitaxial deposition of the quantum structure. The quantum structure can thus be formed, for example, as an epitaxially deposited semiconductor structure. Alternatively, the substrate can also be different from the growth substrate for the quantum structure. The semiconductor component can also have more than one such first conversion element. For example, two or more quantum structures can be provided, in particular, one above the other, that emit radiation at the same second peak wavelength. The efficiency of the radiation conversion can thus be increased.

The quantum structure may contain $Al_xIn_yGa_{1-x-y}N$, $Al_xIn_yGa_{1-x-y}P$ or $Al_xIn_y Ga_{1-x-y}As$. In this case, $0 \leq x \leq 1$, $0 \leq y \leq 1$ and $x+y<1$ applies in each case. With these materials, radiation in the green, yellow or red spectral range can be generated in an efficient way. In principle, each semiconductor material is suitable for the quantum structure whose band gap is suitable to generate secondary radiation with the second peak wavelength to be generated.

Depending on the selected example, the first conversion element 4 can connect to the semiconductor chip 3 with the aid of an optically transparent adhesive. The carrier 5 consists of a material optically transparent for the primary radiation and/or the secondary radiation, in particular, of sapphire.

A second conversion element 7 is arranged on the first conversion element 4. Depending on the selected example, the second conversion element 7 connects to the first conversion element 4 with the aid of an optically transparent adhesive. The second conversion element has a luminescent material, wherein the luminescent material is formed to shift an electromagnetic radiation, in particular the primary radiation, at least partially to a tertiary radiation having a dominant wavelength. Furthermore, depending on the selected example, the arrangement of the semiconductor chip 3, of the first conversion element 4 and of the second conversion element 7 can be embedded laterally in a protective layer 8.

The adhesive can each be a silicone adhesive. A thickness of the adhesive is preferably at least 0.2 μm or 1 μm and/or at most 10 μm or 3 μm.

Depending on the selected example, a lower section 9 of the protective layer 8 that extends to an upper side of the first conversion element can be formed as a reflection layer for the electromagnetic radiation, in particular, comprising titanium oxide. Furthermore, an upper section 10 of the protective layer 8 can be formed in the form of a transparent material such as silicone.

As in all other examples, the drawn layers can follow one another directly and touch each other. The illustrated surfaces and connecting lines are preferably flat and/or straight, unless otherwise indicated. Furthermore, the illustrated surfaces and connecting lines are oriented either parallel or perpendicular to one another, as can be seen from FIG. 1. Preferably, this applies also to all other examples.

Figure 2:
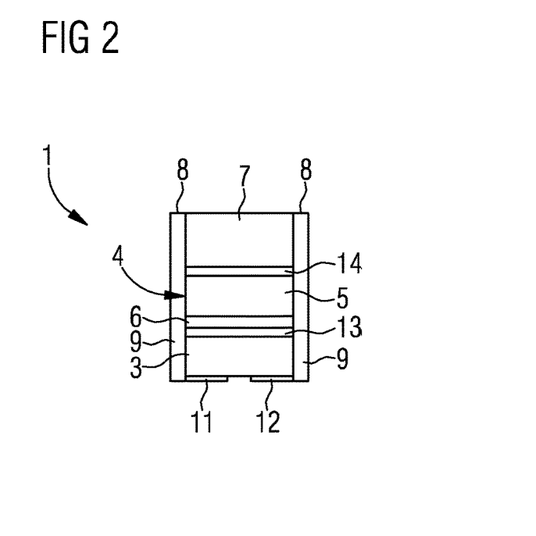
FIG. 2 shows a second example of a semiconductor component.

FIG. 2 shows a schematic illustration of an example of the semiconductor component 1 formed substantially according to FIG. 1, wherein the semiconductor chip 3 is formed in the form of a thin-film semiconductor chip, wherein, in this example, the semiconductor chip 3 has two contact surfaces 11, 12 on the underside.

Figure 3:
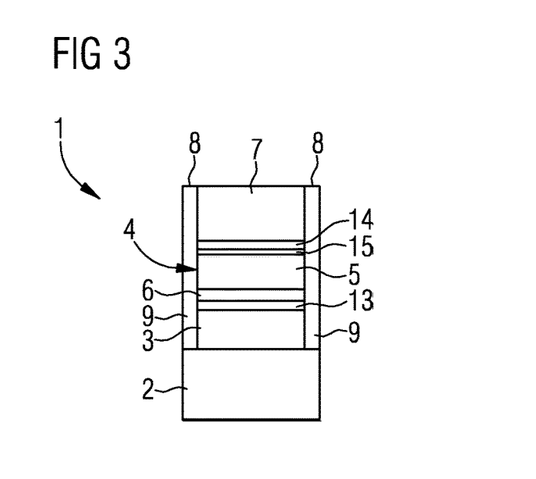
FIG. 3 shows a third example of a semiconductor component.

FIG. 3 shows a further example of the semiconductor component 1 formed substantially according to the example of FIG. 1, wherein a dielectric layer 15, in particular, a Bragg mirror layer, is formed on an upper side of the carrier 5.

Figure 4:
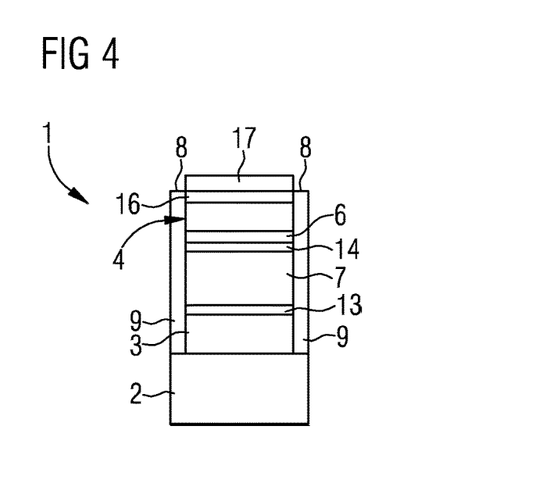
FIG. 4 shows a fourth example of a semiconductor component.

FIG. 4 shows a further example in which the semiconductor chip 3 is arranged on the substrate 2, wherein a second conversion element 7 is arranged on the semiconductor chip 3, which connects to the semiconductor chip 3 via a first adhesive layer 13, for example. Furthermore, a first conversion element 4 is arranged on the second conversion element 7. Depending on the selected example, the first conversion element 4 connects to the second conversion element 7 via a second adhesive layer.

The first conversion element 4 has a carrier 5 on the underside of which a quantum structure 6 in the form of a layer is formed. In addition, in this example, the first conversion element 4 also has a second flat quantum structure 16 on an upper side. In addition, in this example, a cover layer 17 is arranged on an upper side of the first conversion element 4. The cover layer 17 consists of a transparent material, in particular, of transparent silicone. The cover layer represents a protective layer and is transparent, in particular, to the primary radiation, the secondary radiation and the tertiary radiation. Depending on the selected example, the cover layer 17 can be dispensed with. In addition, depending on the selected example, the second quantum structure 16 can be provided only on the upper side and the quantum structure 6 on the underside of the carrier 5 can be dispensed with.

Figure 5:
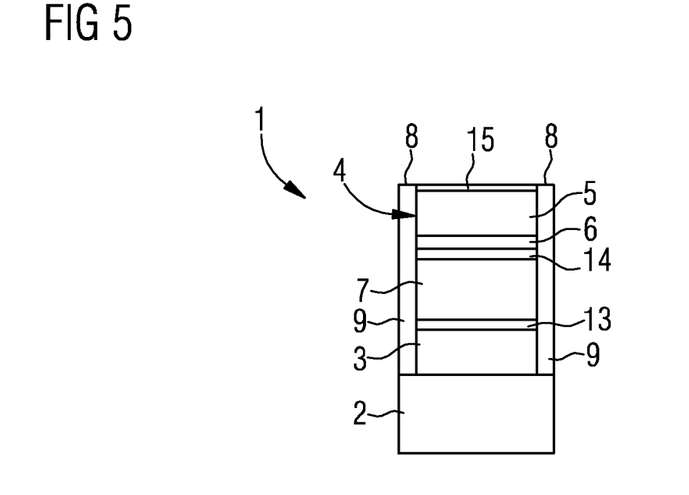
FIG. 5 shows a fifth example of a semiconductor component.

FIG. 5 shows a further example corresponding substantially to the structure of FIG. 4, wherein, in this example, the first conversion element 4 has only one quantum structure 6 on an underside of the carrier 5 facing the second conversion element 7. Furthermore, in this example, a dielectric layer 15 is arranged on an upper side of the carrier 5, in particular, a Bragg mirror layer. Depending on the selected example, the Bragg mirror layer 15 can be dispensed with.

Figure 6:
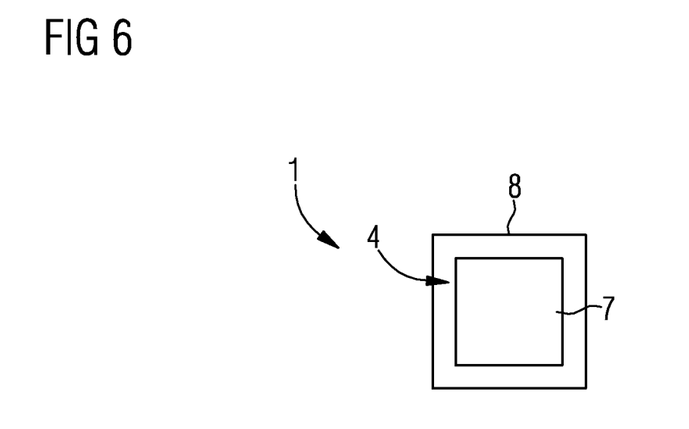
FIG. 6 shows a schematic plan view of the first example of the semiconductor component.

FIG. 6 shows a schematic illustration of a top view onto the semiconductor component according to FIG. 1.

The semiconductor chip 3 of the described examples is formed, for example, to generate light having a spectrum with a peak wavelength between 380 nm and 480 nm. The quantum structure 6 and/or the second quantum structure 16 are formed, for example, to convert the primary radiation generated by the semiconductor chip 3 into a secondary radiation at least partially, wherein the secondary radiation has a spectrum whose peak wavelength is between 520 nm and 545 nm.

The second conversion element 7 of the described examples has at least one or more luminescent materials based, for example, on nitride or fluoride.

These luminescent materials can consist, for example, of the following material system: $Eu^{2+}$ doped nitrides, for example, $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$. Furthermore, the luminescent materials can consist of the following material system: $Mn^{4+}$ doped fluorides, for example, $(K,Na)_2(Si,Ti)F_6:Mn^{4+}$. The dominant wavelengths of the nitridic materials are (excitation wavelength=460 nm) in the range of 590 nm to 640 nm. In addition, the dominant wavelengths of the nitridic materials are in the range of 595 nm to 625 nm for the material systems $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$. In addition, the dominant wavelengths of the nitridic materials can be in the range of 623 nm to 633 nm for the material system $(Sr,Ca)[LiAl_3N_4]:Eu^{2+}$. Furthermore, the dominant wavelengths of the nitridic materials can be 590 nm to 610 nm for the material system $(Ca,Ba,Sr)_2Si_5N_8:Eu^{2+}$. The color locations of the nitridic phosphor materials are, for example, (excitation wavelength=460 nm) in the range of Cx=0.595-0.625; Cy=0.370-0.400 or in the range of Cx=0.655-0.685; Cy=0.300-0.350 or in the range of Cx=0.620-0.655; Cy=0.340-0.370 for the material systems $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$.

The color locations are, for example, (excitation wavelength=460 nm) in the range of Cx=0.680-0.715; Cy=0.280-0.320 for the material system $(Sr,Ca)[LiAl_3N_4]:Eu^{2+}$. The color locations are, for example, (excitation wavelength=460 nm) in the range of Cx=0.610-0.650; Cy=0.340-0.380 for the material system $(Ca,Ba,Sr)_2Si_5N_8:Eu^{2+}$. The dominant wavelength of the fluoride luminescent material is, for example, (excitation wavelength=460 nm) in the range of 610-630 nm. The dominant wavelength of the fluoridic luminescent material is in addition, for example, in the range of 617-624 nm. The color location of the fluoride luminescent material is, for example, (excitation wavelength=460 nm) in the range of Cx=0.680-0.710; Cy=0.290-0.330. The Cx- and Cy-values preferably relate to the CIE standard chromaticity diagram of 1931 and preferably also apply in all other examples.

Figure 7:
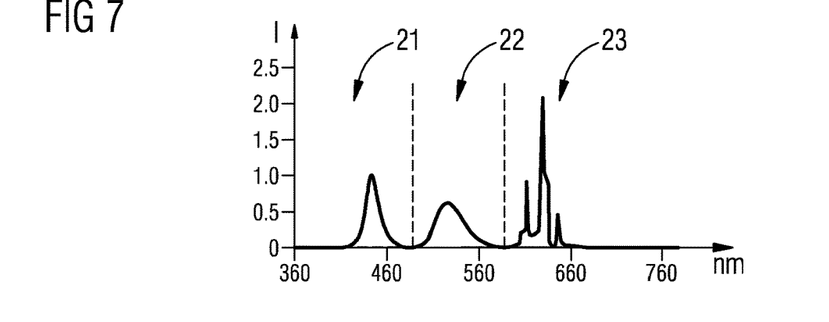
FIG. 7 shows a first diagram of a radiation intensity plotted over the wavelength of a first example.

FIG. 7 shows a schematic representation of a radiation intensity I of a first semiconductor component plotted over the wavelength in nanometers (nm). In a first section 21 of the wavelength spectrum, the blue component, in a second section 22, the green component and in a third section 23 of the wavelength spectrum, the red component of the electromagnetic radiation of a semiconductor component is illustrated. This is, a semiconductor component having a semiconductor chip 3 that generates blue light, wherein the quantum structure 6 and/or the second quantum structure 16 converts the blue light at least partially into green light, and wherein the second conversion element is, for example, $K_2SiF_6:Mn^{4+}$ as the luminescent material and converts a portion of the primary radiation into a tertiary radiation with red light.

Figure 8:
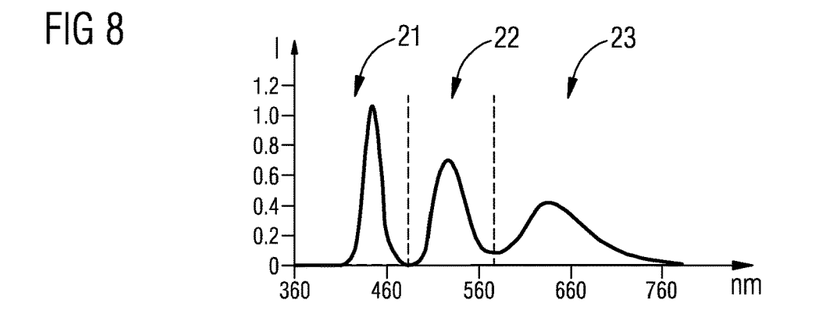
FIG. 8 shows a second diagram of a radiation intensity plotted over the wavelength of a second semiconductor component.

FIG. 8 shows a diagram for an intensity I of a semiconductor component plotted over the wavelength in nanometers. In a first section 21 of the wavelength spectrum, the blue component, in a second section 22 of the wavelength spectrum, the green component and in a third section 23 of the wavelength spectrum, the red component of the electromagnetic radiation of a semiconductor component is illustrated. The semiconductor component has a semiconductor chip 3 that generates blue light as primary radiation, wherein the quantum structure 6 and/or the second quantum structure 16 are formed to convert a portion of the electromagnetic primary radiation generated by the semiconductor chip 3 into green light as secondary radiation. The second conversion element has a luminescent material which, in this case, consists of $Sr(Ca,Sr)Si_2Al_2n_6:Eu^{2+}$ and converts a portion of the primary radiation into a tertiary radiation with red light.

Figure 9:
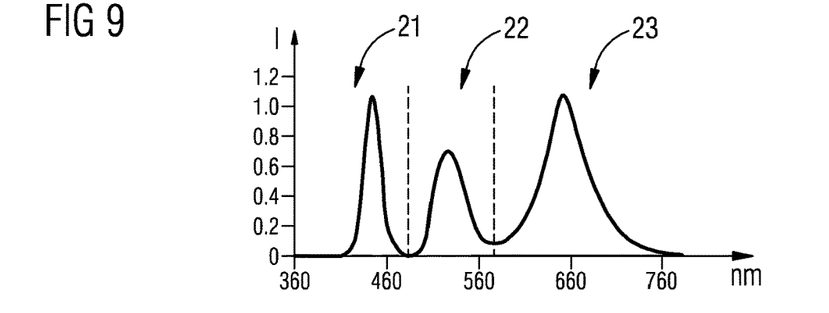
FIG. 9 shows a third diagram of a radiation intensity plotted over the wavelength of a further semiconductor component.

FIG. 9 shows a diagram for an intensity of a semiconductor component plotted over the wavelength in nanometers. In a first section 21 of the wavelength spectrum, the blue component, in a second section 22, the green component and in a third section 23 of the wavelength spectrum, the red component of the electromagnetic radiation of a semiconductor component is illustrated. The semiconductor component has a semiconductor chip 3 that generates blue light as primary radiation, wherein the quantum structure 6 and/or the second quantum structure 16 converts a portion of the blue light into green light. The second conversion element comprises the luminescent material $(Sr,Ca)[Li_3Al_3N_4]:Eu^{2+}$ that converts at least part of the primary radiation into red light.

The cover layer 17 and/or the protective layer 8 can be formed in the form of a scattering layer. The scattering layer contains, for example, scattering particles having a concentration of 10% by weight to 30% by weight. The layer thickness of the scattering layer can be 10 μm to 30 μm. The scattering particles used may be, for example, titanium dioxide, aluminum oxide or zirconium oxide, which are embedded in a carrier material such as, for example, silicone.

The semiconductor component can be arranged on a lead frame embedded in a housing body. The first and the second adhesive layers 13, 14 can contain a polymer material, for example, silicone. The refractive index of the adhesive layers 13, 14 can lie between 1.5 and the refractive index of the material of the semiconductor chip adjoining the adhesive layer. The protective layer 8 can be formed in the form of a reflection layer.

The semiconductor component 1 can be formed in the form of a surface-mountable semiconductor component. In addition, the carrier 5 can also consist of silicon carbide.

The first conversion element having a particularly epitaxially grown quantum structure can be distinguished by high temperature stability. For example, secondary radiation being in the red spectral range or in the green spectral range can have the high temperature stability of a nitride compound semiconductor material based on nitride compound semiconductor material, in particular, on $Al_xIn_yGa_{1-x-y}N$. Furthermore, in such a radiation conversion element, the emission wavelength can be set in a simple manner, in particular by varying the layer thicknesses and the materials of the quantum structure. The degree of conversion can be adjusted in a simple and reliable manner by the number of quantum layers. As an alternative to an epitaxial deposition, another deposition method is also possible, for example, sputtering. Photoluminescent structures can thus be produced particularly inexpensively.

Furthermore, we found that the optical excitation of a quantum structure emitting in the green spectral range, for example, on the basis of $Al_xIn_yGa_{1-x-y}N$, is more efficient than direct radiation generation in such a quantum structure by electrical excitation.

The side of the carrier facing away from the quantum structure can also fulfill additional optical functions, for example, the function of an in particular wavelength-selective mirror or filter, and/or the function of a coupling-out structure, for example, a roughening.

Scattering layers or structures of the semiconductor component furthermore bring about an efficient color mixing. By a dielectric coating, in particular in the form of a Bragg mirror, for example, a wavelength-selective coupling-out and/or formation of a resonant cavity for the generated radiation and/or a pre-filtering of the spectrum of the semiconductor component can be achieved in a simple and reliable manner.

The quantum structure 6, 16 can comprise quantum layers between which barrier layers are arranged. The quantum layers and barrier layers form a multiple quantum well structure. In quantum structures of this type, quantization takes place within the quantum layers along precisely one spatial direction. Such quantum structures can be produced in a particularly reliable manner and are distinguished by a high efficiency. The number of quantum layers can be varied within wide limits. For example, the quantum structures 6, 16 have 2 to 100, for example, 50 quantum layers, each separated from one another by barrier layers. A layer thickness of the quantum layer is preferably 1 nm to 10 nm. A layer thickness of the barrier layers is preferably 3 nm to 100 nm, for example, 15 nm. The barrier layers are preferably formed nominally undoped.

To generate green secondary radiation, the quantum layers preferably have $Al_xIn_yGa_{1-x-y}N$. By increasing the indium proportion and/or a widening of the quantum layers, the peak wavelength of the secondary radiation can be increased. By further increasing the indium proportion, secondary radiation having a peak wavelength in the yellow or red spectral range can also be achieved. Furthermore, the material system $Al_xIn_yGa_{1-x-y}P$ is also suitable for secondary radiation in the red spectral range.

For peak wavelengths greater than or equal to 440 nm, the quantum layers are preferably free of aluminum or substantially free of aluminum, for example, with $x \leq 0.05$. Furthermore, the indium content y is preferably above 50%, for example, 0.45 to 0.55, in particular 0.44 to 0.52. Such materials can be epitaxially deposited on gallium arsenide with high crystal quality.

The first conversion element 4 has a carrier 5. The carrier 5 can be the growth substrate for the epitaxial deposition of the quantum structure 6, 16. In particular, in a growth substrate which is not radiation-transmissive for the primary radiation, for example, in gallium arsenide, the quantum structure 6, 16 can also be transferred to a substrate different from the growth substrate, for example, onto a glass substrate. In this case, the substrate is thus different from a growth substrate for the quantum structure and mechanically stabilizes the quantum structure. For this purpose, the growth substrate is no longer required and can be removed such that the radiation conversion element is free of a growth substrate.

The dielectric layer 15 can be formed in multiple layers with a plurality of layers, wherein adjacent layers of the dielectric coating differ from one another with respect to the refractive index. The dielectric layer 15 can be formed, for example, such that the primary radiation is at least partially reflected back into the first conversion element 4 and the secondary radiation exits virtually unimpeded. Furthermore, a resonant cavity can be formed by the dielectric coating 5 for at least one radiation component, i.e. for the primary radiation and/or the secondary radiation and/or the tertiary radiation. The dielectric layer 15 can have, for example, a plurality of dielectric layers, wherein layers adjoining one another each have different refractive indices from one another. The dielectric layer 15 has, for example, a wavelength-selective transmission. The transmission is thus greater for one spectral range than for another spectral range. For example, the dielectric layer 15 is formed reflective for at least one radiation component, for example, the primary radiation or a part of the primary radiation. Alternatively or in addition, the emitted spectrum can be pre-filtered by the dielectric coating, for example, with regard to specific customer requirements. The dielectric layer 15 can be formed as a Bragg mirror layer.

The described semiconductor components are particularly suitable for the backlighting of display devices, for example, liquid crystal displays (LCDs). However, the semiconductor components can also be used for any other type of illumination.

Although our components have been further illustrated and described in detail by preferred examples, this disclosure is not limited by the examples and other variations can be derived by those skilled in the art, without departing from the scope of the appended claims.

This application claims priority of DE 10 2015 119 817.7, the subject matter of which is incorporated herein by reference.

The invention claimed is:

1. A semiconductor component comprising:
   a semiconductor chip that generates an electromagnetic primary radiation, which is blue light, having a first peak wavelength,
   having a first conversion element having a quantum structure and the quantum structure comprises a plurality of quantum layers, between which barrier layers are arranged so that the quantum layers and the barrier layers form a multiple quantum well structure, wherein the quantum structure is formed to partially shift the primary radiation to a secondary radiation having a second peak wavelength and the secondary radiation is green light, and
   a second conversion element having a luminescent material, wherein the luminescent material has an $Eu^{2+}$-doped nitride or a $Mn^{4+}$-doped fluoride and is formed to shift an electromagnetic radiation to a tertiary radiation having a dominant wavelength, wherein the first conversion element is formed to generate the secondary radiation having a lower peak wavelength than the dominant wavelength of the tertiary radiation and the tertiary radiation is red light.

2. The semiconductor component according to claim 1, wherein the luminescent material is formed to generate tertiary radiation having a dominant wavelength between 590 nm and 640 nm, and the second conversion element is located between the semiconductor chip and the first conversion element.

3. The semiconductor component according to claim 2, wherein the luminescent material is formed to generate tertiary radiation having a dominant wavelength between 595 nm and 610 nm.

4. The semiconductor component according to claim 2, wherein the luminescent material is formed to generate tertiary radiation having a dominant wavelength between 617 nm and 624 nm.

5. The semiconductor component according to claim 1, wherein the luminescent material is $(K,Na)_2(Si,Ti)F_6:Mn^{4+}$.

6. The semiconductor component according to claim 1, wherein the luminescent material is selected from the group consisting of $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$ and $(Sr,Ca)[LiAl_3N_4]:Eu^{2+}$.

7. The semiconductor component according to claim 1, wherein the semiconductor chip is formed to generate primary radiation having a peak wavelength between 380 nm and 480 nm.

8. The semiconductor component according to claim 1, wherein the first conversion element is formed to generate secondary radiation having a peak wavelength between 520 nm and 545 nm.

9. The semiconductor component according to claim 1, wherein the first conversion element is arranged on the semiconductor chip, the second conversion element is arranged on the first conversion element, the first conversion element has a transparent carrier, the quantum structure is arranged on an underside of the carrier, the underside faces the semiconductor chip, and the carrier consists of sapphire.

10. The semiconductor component according to claim 9, wherein the carrier has a Bragg mirror layer on an upper side facing the second conversion element.

11. The semiconductor component according to claim 1, wherein the second conversion element is arranged on the semiconductor chip, the first conversion element is arranged on the second conversion element, the first conversion element comprises a transparent carrier, the quantum structure is arranged on an underside of the carrier, the underside faces the second conversion element, and the carrier is made of sapphire.

12. The semiconductor component according to claim 1, wherein the carrier has a second quantum structure on an upper side.

13. The semiconductor component according to claim 1, wherein at least one upper side of the semiconductor component is covered with a transparent cover layer made of silicone.

14. The semiconductor component according to claim 1, wherein at least a part of the side surfaces of the semiconductor component is covered with a reflective protective layer.

* * * * *